(12) United States Patent
Kim

(10) Patent No.: US 6,184,075 B1
(45) Date of Patent: Feb. 6, 2001

(54) METHOD OF FABRICATING INTERCONNECT LINES AND PLATE ELECTRODES OF A STORAGE CAPACITOR IN A SEMICONDUCTOR DEVICE

(75) Inventor: Byeung-chul Kim, Kyungki-do (KR)

(73) Assignee: Samsung Electronics Co., Ltd., Suwon (KR)

( * ) Notice: Under 35 U.S.C. 154(b), the term of this patent shall be extended for 0 days.

(21) Appl. No.: 09/229,336

(22) Filed: Jan. 13, 1999

Related U.S. Application Data

(62) Division of application No. 08/698,257, filed on Aug. 14, 1996.

(30) Foreign Application Priority Data

Aug. 22, 1995 (KR) .................................................. 95-25966

(51) Int. Cl.⁷ ............................................... H01L 21/8242
(52) U.S. Cl. ............................................. 438/238; 438/253
(58) Field of Search ........................... 438/238, 253–256, 438/396–399

(56) References Cited

U.S. PATENT DOCUMENTS 5,079,670 * 1/1992 Tigelaar et al. .
5,580,813 * 12/1996 Hachisuka et al. .
5,604,365 * 2/1997 Kajigaya et al. .................... 257/296

* cited by examiner

*Primary Examiner*—Jey Tsai
(74) *Attorney, Agent, or Firm*—Jones Volentine, LLC

(57) ABSTRACT

A method of fabricating a semiconductor device where the formation of a conductive layer typically over a storage capacitor on the device is used both as a plate electrode and also as an interconnect line. The method therefore combines the fabrication process steps of forming a plate electrode with the steps of forming a wiring layer. In a preferred embodiment, the storage capacitor is part of a cell array portion of a semiconductor memory device, whereas the interconnect line is in a peripheral portion of the memory device.

9 Claims, 9 Drawing Sheets

CELL ARRAY PORTION

PERIPHERAL CIRCUIT PORTION

CELL ARRAY PORTION

PERIPHERAL CIRCUIT PORTION

CELL ARRAY PORTION

PERIPHERAL CIRCUIT PORTION

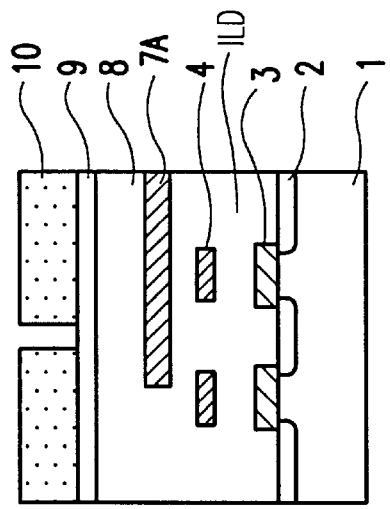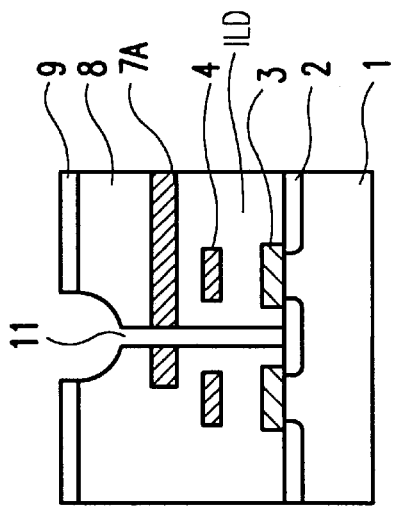
FIG.11A  FIG.11B
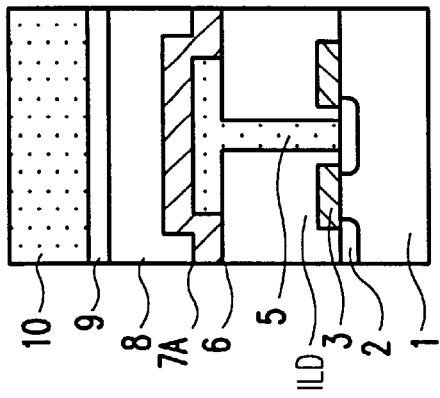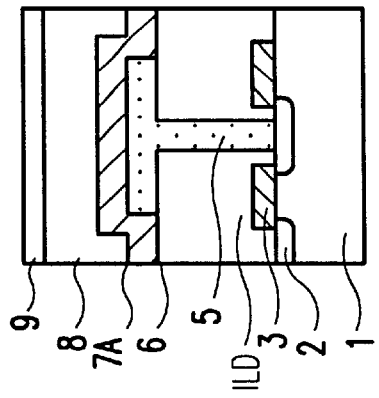
FIG.12A  FIG.12B

CELL ARRAY PORTION

PERIPHERAL CIRCUIT PORTION

CELL ARRAY PORTION

PERIPHERAL CIRCUIT PORTION

CELL ARRAY PORTION

PERIPHERAL CIRCUIT PORTION

METHOD OF FABRICATING INTERCONNECT LINES AND PLATE ELECTRODES OF A STORAGE CAPACITOR IN A SEMICONDUCTOR DEVICE

CROSS REFERENCE TO RELATED APPLICATIONS

This is a divisional application of application Ser. No. 08/698,257, filed Aug. 14, 1996, the contents of which are hereby incorporated by reference in their entirety.

BACKGROUND OF THE INVENTION

The present invention is directed to a method of fabricating semiconductor devices. In particular, the invention is directed to a method of fabricating interconnect lines together with plate electrodes of a storage capacitor in a semiconductor device such as a semiconductor memory.

The chosen method of fabricating interconnect lines or wiring layers in a semiconductor device plays an important role in the production of semiconductor devices such as semiconductor memories (e.g., dynamic random access memories (DRAM), static random access memories (SRAM), etc.). The manner in which such interconnect lines are fabricated in the device may affect the processing speed and reliability of the device, as well as the manufacturing yield of the production.

With the constant pressure to achieve higher integration in semiconductor devices, especially in memory devices, the skilled artisan is required to forego the horizontal expansion of the integration across the base of the device in favor of vertical development. This increase in vertical integration of a semiconductor device typically involves applying multiple layers of integration, thus, leading to an increase in the aspect ratio (i.e., ratio of vertical height to the horizontal length) of the device. High aspect ratios lead to significant problems in the fabrication process. Each layer added to the design of the semiconductor device increases the complexity of and time delay in overall production time.

FIGS. 1A–5B illustrate a conventional semiconductor device during fabrication having a relatively high aspect ratio (approximately 4.5–5.5). (For ease of illustration, among FIGS. 1A–5B, figures labeled with like numbers represent the semiconductor device during the same process step of fabrication. Figures having a suffix "A," however, represent a cross-sectional view of the cell array portion of a conventional semiconductor memory device viewed along line "A—A" of FIG. 5A, whereas figures having a suffix "B," represent a cross-sectional view of the peripheral circuit portion of the same semiconductor memory device viewed along line "B—B" of FIG. 5B.)

The conventional semiconductor memory device shown in FIG. 1A is fabricated with a source/drain region 2 and gate electrode 3 of a transistor formed on a semiconductor substrate 1. Over the electrode region 3 an inter layer dielectric (ILD) is patterned having bit lines 4 formed as shown in FIG. 1B. A storage electrode 5 (FIG. 1A) is patterned in and above the ILD. A dielectric film 6 is deposited over the storage electrode 5, together with a plate electrode 7. The dielectric film 6 and electrode 7 are patterned to complete a storage cell capacitor for the memory cell in the cell array of the semiconductor memory device.

A planarization layer 8 (FIG. 2A) is used to planarize the step coverage produced by the fabrication process. Material such as $O_3$-TEOS (tetra ethoxy silane) is typically used and deposited to a thickness of 3000–7000 A (angstroms). An insulation layer 9, typically made of PE-TEOS (plasma enhanced-tetra ethoxy silane), is deposited to a thickness of 1000–3000 A. A layer of photoresist 10 is then formed and patterned to allow for the formation of a contact hole in the peripheral portion of the semiconductor device, as shown in FIG. 2B. As shown in FIGS. 3A and 3B, the semiconductor device is then exposed to an isotropic-etching process step that etches insulation layer 9 and planarization layer 8 to a depth of 1000–4000 A. The remainder of the planarization layer 8 and ILD are then etched using an anisotropic-etching process to form contact hole 11 over source/drain region 2 (FIG. 3B).

Tungsten is deposited in the contact hole 11 and on the top surface of the semiconductor device to a thickness of 2000–5000 A to form a conductive layer 12. This layer is patterned to form interconnect line 12 in the peripheral portion of the semiconductor device, as shown in FIG. 4B. FIGS. 5A and 5B show mask works used during the fabrication process to form the various layers of the cell array portion and the peripheral portion, respectively, of the semiconductor memory device. As shown in FIG. 5A, a gate electrode mask 3', a bit line mask 4', a storage electrode mask 5', and a plate electrode mask 7' are respectively used to form the gate electrode 3, bit line 4, storage electrode 5, and plate electrode 7 of the cell array portion of the semiconductor device. Similarly, in FIG. 5B, gate electrode mask 3', bit line mask 4', contact hole mask 11', and interconnect line mask 12' are respectively used to form the gate electrode 3, bit line 4, contact hole 11, and interconnect line 12 of the peripheral portion of the semiconductor device.

As can be seen from the above brief description of the fabrication process for a conventional semiconductor device, a semiconductor device, such as a memory device, having high integration requires a multitude of layers. Any increase in integration, for example, adding interconnect lines or wiring layers, would increase the aspect ratio. As the aspect ratio increases, the problems in fabrication and reliability of the device increase. For example, because the contact hole 11 (FIG. 3B) is so deep (i.e., 1.2 microns), the gas used to etch the contact hole in the anisotropic-etching process step cannot react properly with the oxide layer at the bottom of the contact hole. As a result, the metal contact necessary for the reliable operation of the semiconductor device is inferior. Furthermore, such an increase in the number of layers causes significant delays in the overall production of the semiconductor devices as each new layer adds one or more steps to the overall fabrication process, thus, further complicating and delaying the manufacture of the devices.

SUMMARY OF THE INVENTION

It is an object of the present invention to provide a method that permits the increase of integration of semiconductor devices without a corresponding increase in the aspect ratio of the devices.

It is an object of the invention to provide a method that allows fabrication of highly integrated semiconductor devices without further complicating or delaying the fabrication process.

The present invention accomplishes the above and other objects and advantages by providing a method of fabricating a semiconductor device where the formation of a conductive layer typically over a storage capacitor on the device is used both as a plate electrode and also as an interconnect line. The method therefore combines the fabrication process steps of forming a plate electrode with the steps of forming a wiring layer. In a preferred embodiment, the storage capacitor is part of a cell array portion of a semiconductor memory device, whereas the interconnect line is in a peripheral portion of the memory device.

Using the present invention, the high levels of integration desired in semiconductor devices can be achieved without increasing the aspect ratio and without adding complex, time-consuming, and costly process steps to the overall fabrication process. As a result, the contact inferiority and unreliability found in highly integrated semiconductor devices having high aspect ratios produced in accordance with conventional fabrication processes can be obviated. In addition, because the conductive layer of the semiconductor device fabricated in accordance with the present invention functions as the plate electrode of the storage capacitor in the cell array portion of the memory device, as well as functioning as the interconnect layer in the peripheral portion of the device, the added wiring layer does not require a separate patterning process step. The increase in integration therefore does not require an accompanying increase in process steps and corresponding process delays.

BRIEF DESCRIPTION OF THE DRAWINGS

The foregoing and other objects and advantages of the present invention will become more apparent from the detailed description of the preferred embodiments of the present invention given below with reference to the accompanying drawings in which:

FIGS. 11A and 11B respectively illustrate the cell array and peripheral circuit portions of a semiconductor memory device having a layer of photoresist deposited in accordance with a second embodiment of the present invention;

FIGS. 12A and 12B respectively illustrate the cell array and peripheral circuit portions of a semiconductor memory device having a contact hole formed in accordance with a second embodiment of the present invention;

DETAILED DESCRIPTION OF INVENTION

The present invention will be described in detail herein as embodied in the preferred embodiments illustrated in FIGS. 6A–19B. Although these embodiments depict the invention as applied to a semiconductor memory device, it should be readily apparent that the invention has equal application to any type of semiconductor device that encounters problems related to an increase in vertical integration or can otherwise benefit from a reduction in the number of process steps required in fabrication. (For ease of illustration, among FIGS. 6A–19B, figures labeled with like numbers represent a semiconductor device made in accordance with the invention during the same process step of fabrication. Figures having a suffix "A," however, represent a cross-sectional view of the cell array portion of the semiconductor device as viewed along line "A—A" of one of FIGS. 9A, 14A, or 19A, corresponding to the embodiment illustrated, whereas figures having a suffix "B," represent a cross-sectional view of the peripheral circuit portion of the same semiconductor memory device viewed along line "B—B" of one of FIGS. 9B, 14B, or 19B corresponding to the embodiment illustrated.)

Figure 6A:
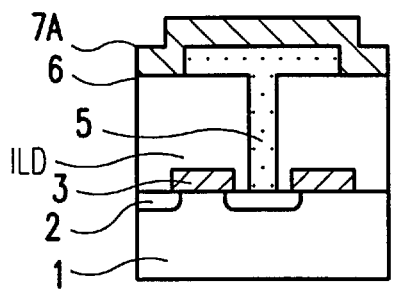
FIGS. 6A and 6B respectively illustrate the cell array and peripheral circuit portions of a semiconductor memory device having a first conductive layer formed in accordance with a first embodiment of the present invention.
Figure 6B:
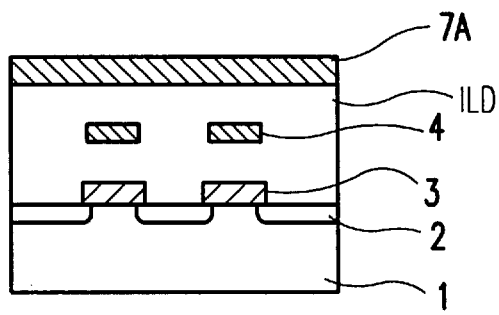

FIGS. 6A and 6B illustrate a semiconductor device such as a DRAM device having a cell array portion in which transistors are made of source/drain regions 2 within a base of silicon substrate 1, and gate electrodes 3 deposited on substrate 1 above a channel region connecting adjacent or spaced apart source/drain regions 2. An inter layer dielectric (ILD) layer is formed over the transistors having bit lines 4 deposited therein, as shown in FIG. 6B. The ILD may be formed, for example, from annealing BPSG (boron phosphorous silicate glass) film in an atmosphere of nitrogen gas ($N_2$). Any other known method of forming ILD, however, may suffice, including the use of HTO (high temperature oxide) film or USG (undoped silicate glass) film.

A storage electrode 5 is formed in the cell array portion of the semiconductor memory device over the ILD. In the preferred embodiment, doped polysilicon having a thickness of 3000–7000 A (angstroms) is used for the storage electrode 5. (Any suitable dopant material, however, such as phosphorus, arsenic, boron or an equivalent may be used as a dopant for the polysilicon used in the storage electrode.) The storage electrode 5 is covered by a dielectric film 6 formed from $Ta_2O_5$ with a thickness of 50–150 A in the preferred embodiment. Other known dielectric films deemed suitable, such as ONO (oxide nitride oxide), BZT ($Ba_xSr_{1-x}TiO_3$), PZT ($PbZrTiO_3$), or other equivalent material may be utilized.

A layer of polysilicon doped with ions of an element from Group V of the periodic table (i.e., vanadium, niobium, tantalum, unnilpentium, nitrogen, phosphorus, arsenic, antimony, bismuth) is then formed as conductive layer 7A. (Although polysilicon is used to describe this embodiment of the invention, it should be understood that any material suitable for use as a conductive layer, such as tungsten, can be used in practicing the present invention.) The conductive layer 7A serves as the plate electrode of the storage capacitor in the cell array portion of the semiconductor memory device. Rather than terminating the conductive layer 7A at the end of the cell array portion, the conductive layer 7A is extended over the ILD in the peripheral circuit portion of the semiconductor memory device.

Figure 7A:
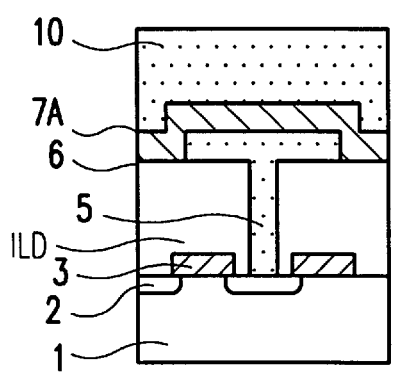
FIGS. 7A and 7B respectively illustrate the cell array and peripheral circuit portions of a semiconductor memory device having a layer of photoresist deposited in accordance with a first embodiment of the present invention.
Figure 7B:
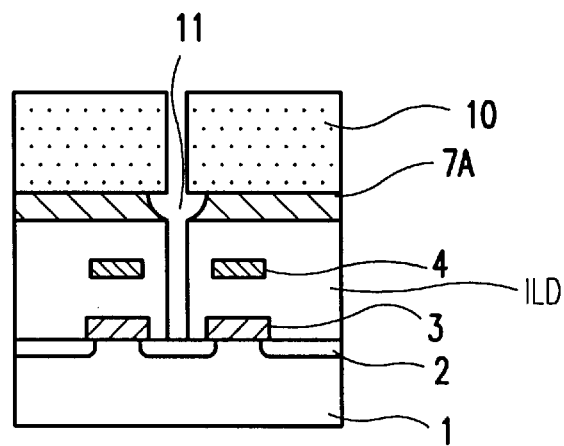

As shown in FIGS. 7A and 7B, a layer of photoresist 10 is added and patterned to begin formulation of contact hole 11. Using an isotropic-etching technique, an opening for the contact hole 11 is formed in conductive layer 7A. The ILD material is then anisotropically etched over the desired contact area, for example, on source/drain region 2 of substrate 1, to complete the formation of contact hole 11. (In FIG. 7B, the contact hole 11 is illustrated as appearing over a source/drain region 2 in the peripheral portion of the semiconductor device. It should be understood that the contact hole could appear in any area or portion of the semiconductor device without detracting from the present invention.)

Figure 8A:
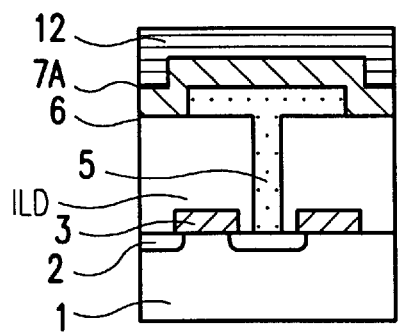
FIGS. 8A and 8B respectively illustrate the cell array and peripheral circuit portions of a semiconductor memory device having a second conductive layer formed in accordance with a first embodiment of the present invention.
Figure 8B:
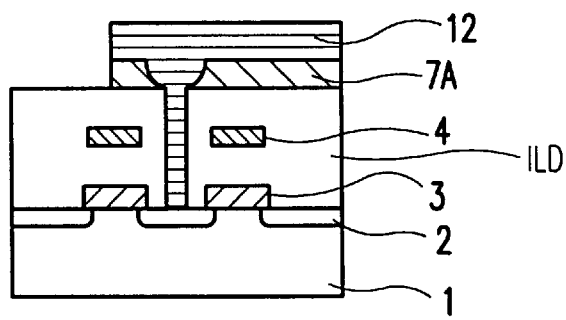

To form an interconnect line for the semiconductor memory device, a suitable conductive material such as tungsten is deposited on the conductive layer 7A to form a second conductive layer 12, as shown in FIGS. 8A and 8B. In this preferred embodiment, the tungsten material is deposited in contact hole 11 and on the surface of conductive layer 7A to a thickness of 2000–8000 A. (Although tungsten is used in this preferred embodiment as the additional conductive layer, it should be appreciated that any other suitable conductive material such as aluminum may be used in the practice of the invention.) Both conductive layer 7A and second conductive layer 12 are exposed to an etching process step that concurrently patterns the two conductive layers to the desired form, as shown in FIG. 8B.

Figure 9A:
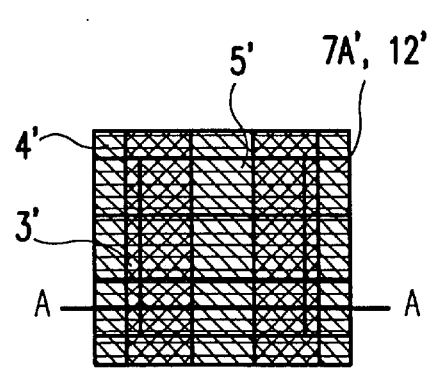
FIGS. 9A and 9B respectively illustrate mask works used to form the cell array and peripheral circuit portions of a semiconductor memory device in accordance with the process steps illustrated in FIGS. 6A–8B.
Figure 9B:
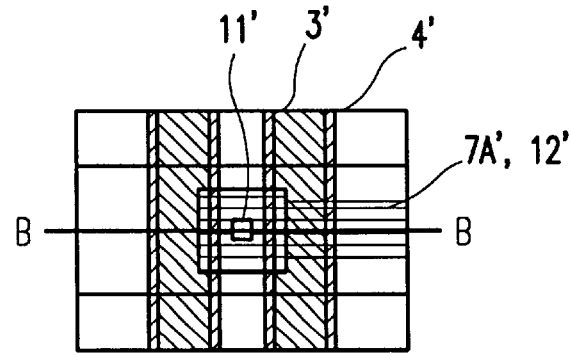

FIGS. 9A and 9B show mask works used during the novel fabrication process to form the various layers of the cell array portion and the peripheral portion, respectively, of the semiconductor memory device. As shown in FIG. 9A, a gate electrode mask 3', a bit line mask 4', a storage electrode mask 5', a plate electrode mask 7A', and an interconnect line mask 12' are respectively used to form the gate electrode 3, bit line 4, storage electrode 5, plate electrode 7A, and interconnect line 12 of the cell array portion of the semiconductor device. Similarly, in FIG. 9B, gate electrode mask 3', bit line mask 4', plate electrode mask 7A', contact hole mask 11', and interconnect line mask 12' are respectively used to form the gate electrode 3, bit line 4, plate electrode 7A, contact hole 11, and interconnect line 12 of the peripheral portion of the semiconductor device.

As can be seen from the description above, the semiconductor device, shown in FIGS. 6A–9B, fabricated in accordance with the present invention permits the addition of a wiring layer (i.e., interconnect line) in the peripheral portion of the semiconductor device without adding process steps to the overall fabrication process. Indeed, because the conductive layer 7A is used as both the plate electrode for the storage electrode 5 in the cell array portion, and also as the interconnect line in the peripheral portion of the semiconductor device, the separate photolithography steps of patterning a plate electrode and an interconnect line can be combined into one step. The increase in integration of the device, therefore, does not necessitate the same complexity and delay inherent in the conventional fabrication process when integration is increased.

The invention also produces a semiconductor device having an aspect ratio of 3 compared with the aspect ratios between 4.5 and 5.5 found in devices fabricated in accordance with conventional processes. The lower aspect ratio achieved through the present invention eliminates the need for complex and costly fabrication technology without sacrificing higher integration. Moreover, the semiconductor device resulting from the inventive fabrication process has a reduced contact hole depth (i.e., less than 1 micron) due to the use of the conductive layer 7A in the peripheral portion as part of the interconnect line of the semiconductor device. The smaller contact hole depth avoids the etching problems found in conventional processes that produce devices having larger depths.

Figure 1B:
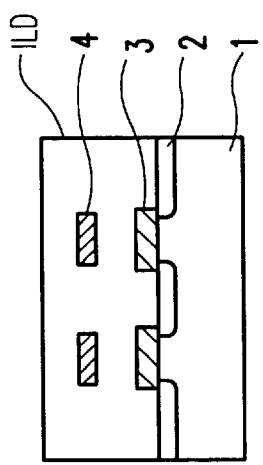
FIGS. 1A and 1B respectively illustrate the cell array and peripheral circuit portions of a conventional semiconductor memory device during the formation of the storage electrode in the cell array portion.
Figure 2B:
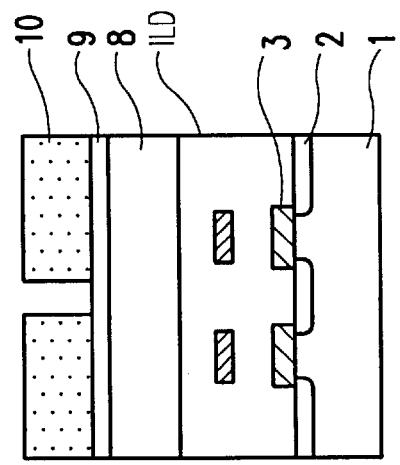
FIGS. 2A and 2B respectively illustrate the cell array and peripheral circuit portions of a conventional semiconductor memory device during the deposition of a photoresist layer on the device.
Figure 1A:
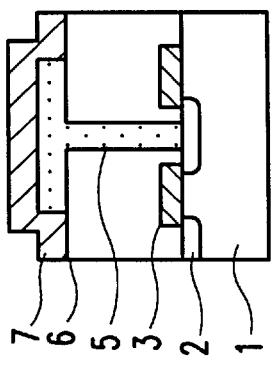
Figure 2A:
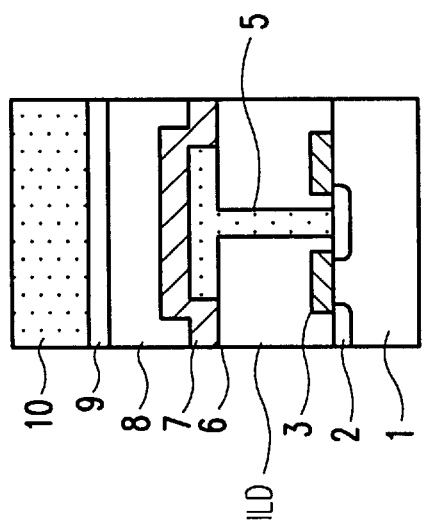
Figure 3B:
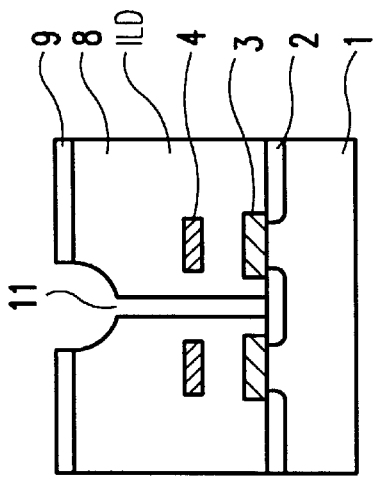
FIGS. 3A and 3B respectively illustrate the cell array and peripheral circuit portions of a conventional semiconductor memory device during the formation of a contact hole of the device.
Figure 4B:
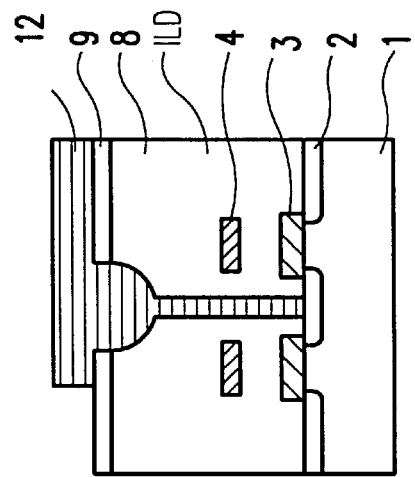
FIGS. 4A and 4B respectively illustrate the cell array and peripheral circuit portions of a conventional semiconductor memory device during the formation of an interconnect line of the device.
Figure 3A:
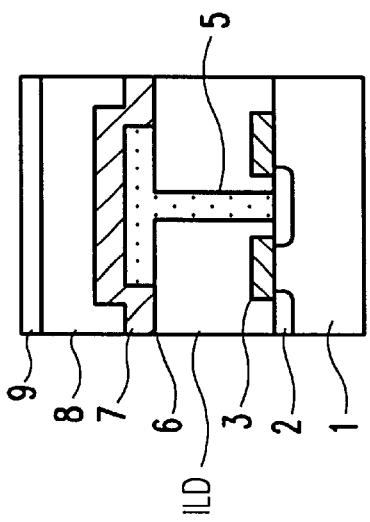
Figure 4A:
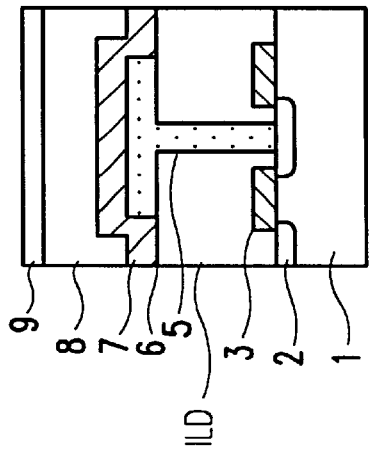
Figure 5A:
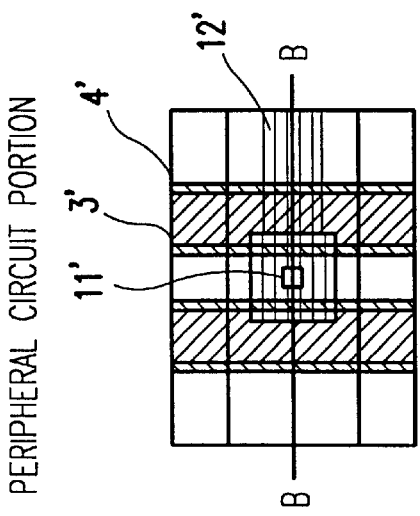
FIGS. 5A and 5B respectively illustrate mask works used to form the cell array and peripheral circuit portions of a conventional semiconductor memory device.
Figure 5B:
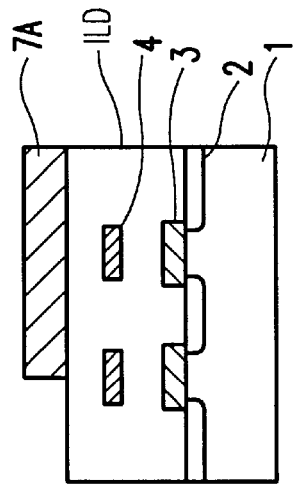
Figure 10A:
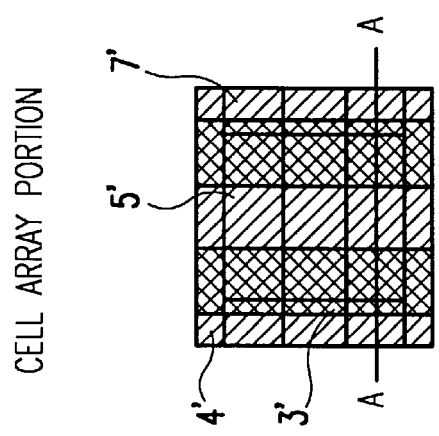
FIGS. 10A and 10B respectively illustrate the cell array and peripheral circuit portions of a semiconductor memory device having a first conductive layer formed in accordance with a second embodiment of the present invention.
Figure 10B:
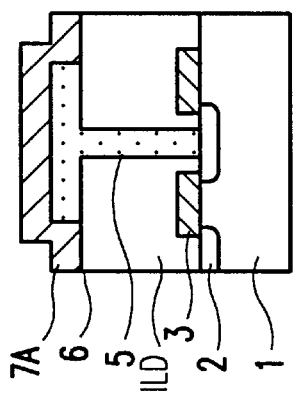

In another embodiment of the present invention, the process shown in FIGS. 6A–9B (described above) is modified in the following manner. After conductive layer 7A is deposited in the manner described in the previous embodiment, the conductive layer 7A is patterned as desired (FIG. 10A and 10B). A planarization layer 8 is then deposited (FIGS. 11A and 11B) to a thickness of 3000–6000 A. (Although this embodiment employs $O_3$-TEOS as the planarization material, any other material suitable for planarizing the surface of a substrate may be used in practicing the invention. For example, the planarization layer 8 may be formed as a BPSG film subjected to an annealing process at temperatures of 800–900° C. in an atmosphere of $N_2$.) Insulation layer 9 is then deposited to a thickness of 1000–3000 A using, PE-TEOS (or other suitable insulation material such as oxidation film). On the insulation layer 9 a photoresist film 10 is deposited and patterned in order to form a contact hole in the peripheral portion of the semiconductor device.

In forming the contact hole 11 (FIG. 12B), the insulation layer 9 and planarization layer 8 are isotropically etched to a depth of 1000–4000 A. Anisotropically etching the remaining portion of planarization layer 8 and the first conductive layer over the desired contact point, for example, over source/drain region 2 of substrate 1, completes the formation of contact hole 11.

Figure 13A:
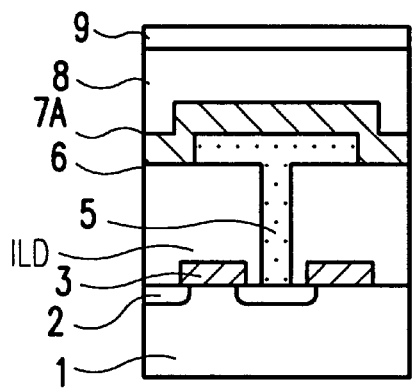
FIGS. 13A and 13B respectively illustrate the cell array and peripheral circuit portions of a semiconductor memory device having a second conductive layer formed in accordance with a second embodiment of the present invention.
Figure 13B:
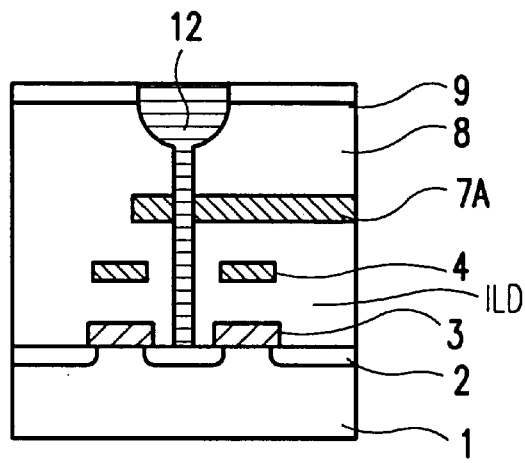

The contact hole 11 is filled with a conductive material such as tungsten, aluminum, or other suitable material. This conductive material is deposited in the hole 11 and on the surface of the device to a thickness of 2000–8000 A to form a second conductive layer 12 (FIG. 13B). This conductive layer 12 is then etched-back so that only the material within the contact hole 11 remains.

Figure 14A:
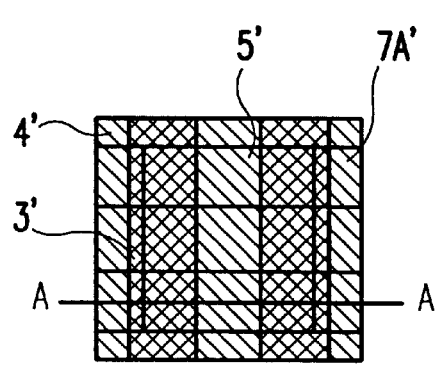
FIGS. 14A and 14B respectively illustrate mask works used to form the cell array and peripheral circuit portions of a semiconductor memory device in accordance with the process steps illustrated in FIGS. 10A–13B.
Figure 14B:
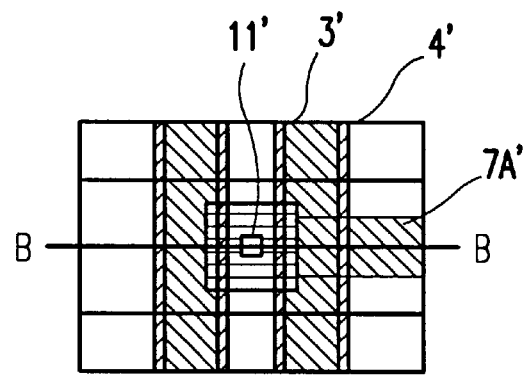

FIGS. 14A and 14B show mask works used during the novel fabrication process of this embodiment to form the various layers of the cell array portion and the peripheral portion, respectively, of the semiconductor memory device. As shown in FIG. 14A, a gate electrode mask 3', a bit line mask 4', a storage electrode mask 5', and plate electrode mask 7A' are respectively used to form the gate electrode 3, bit line 4, storage electrode 5, and plate electrode 7A of the cell array portion of the semiconductor device. Similarly, in FIG. 14B, gate electrode mask 3', bit line mask 4', plate electrode mask 7A', and contact hole mask 11', are respectively used to form the gate electrode 3, bit line 4, plate electrode 7A, contact hole 11, of the peripheral portion of the semiconductor device.

Using the process according to this embodiment, the interconnect line in the peripheral portion of the semiconductor device has the second conductive layer 12 in direct contact with source/drain region 2, and in side-wall contact with conductive layer 7A. Because the conductive layer 7A is patterned for use as an interconnect line in the peripheral portion concurrently with the patterning of the layer 7A as a plate electrode in the cell array portion, no additional metal patterning steps are required to form the wiring layer of the semiconductor device.

Figure 15A:
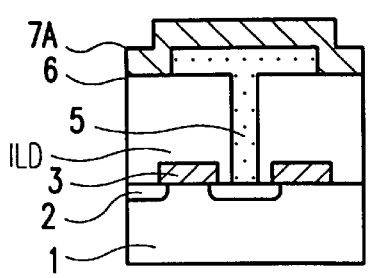
FIGS. 15A and 15B respectively illustrate the cell array and peripheral circuit portions of a semiconductor memory device having a first conductive layer formed in accordance with a third embodiment of the present invention.
Figure 15B:
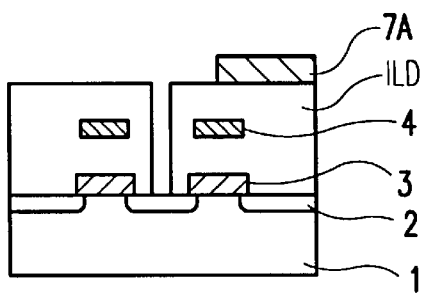

In yet another embodiment of the invention, the same process steps discussed above with respect to the other embodiments of the invention, namely the steps used to form source/drain regions 2 (FIGS. 15A and 15B), gate electrodes 3, bit lines 4, the ILD, storage electrode 5, dielectric film 6, and conductive layer 7A, are duplicated in this embodiment. The conductive layer 7A, however, is patterned so as to permit the formation of a wider metal contact area, as shown in FIG. 15B. The conductive layer 7A continues to function both as the plate electrode for storage electrode 5 in the cell array portion of the semiconductor device, and also as the interconnect line for the peripheral portion of the device.

Figure 16A:
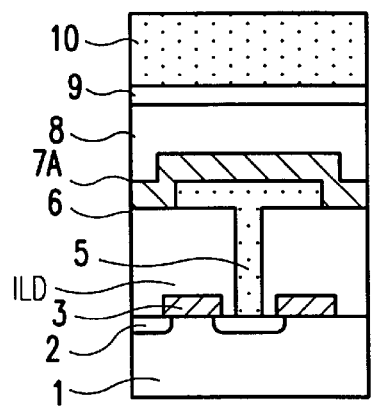
FIGS. 16A and 16B respectively illustrate the cell array and peripheral circuit portions of a semiconductor memory device having a layer of photoresist deposited in accordance with a third embodiment of the present invention.
Figure 16B:
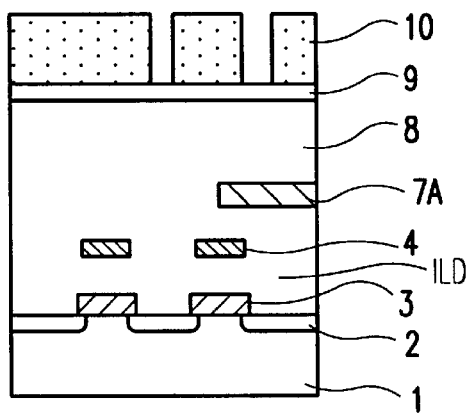
Figure 17A:
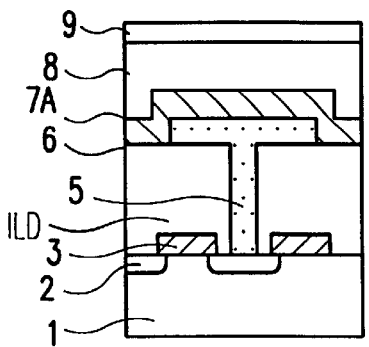
FIGS. 17A and 17B respectively illustrate the cell array and peripheral circuit portions of a semiconductor memory device having contact holes formed in accordance with a third embodiment of the present invention.
Figure 17B:
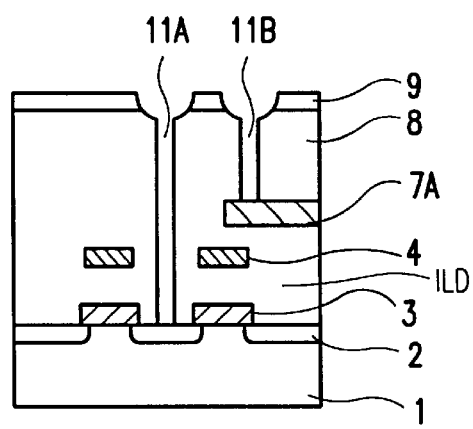

As shown in FIGS. 16A and 16B, a planarization layer 8, insulation layer 9, and photo resist layer 10 are all deposited in the same manner as in the previously described embodiments. The photoresist layer 10, however, is patterned in such a way as to facilitate the formation of two adjacent contact holes. The two contact holes 11A and 11B (FIG. 17B) are formed through an etching process. First, an isotropic-etching process step etches insulation layer 9 and planarizing layer 8 to a depth of 1000–4000 A. Second, an anisotropic-etching process step etches the remaining portion of the planarization layer 8 and the ILD over the desired contact point, for example, source/drain region 2 of the silicon substrate 1, to form contact hole 11A. For the formation of the second contact hole 11B, the anisotropic-etching process step forms an opening over a contact area on conductive layer 7A, as shown in FIG. 17B.

Figure 18A:
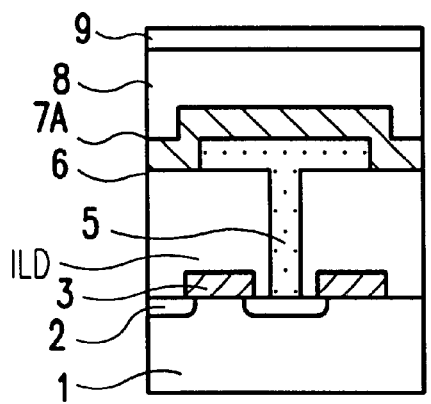
FIGS. 18A and 18B respectively illustrate the cell array and peripheral circuit portions of a semiconductor memory device having a second conductive layer for med in accordance with a third embodiment of the present invention.
Figure 18B:
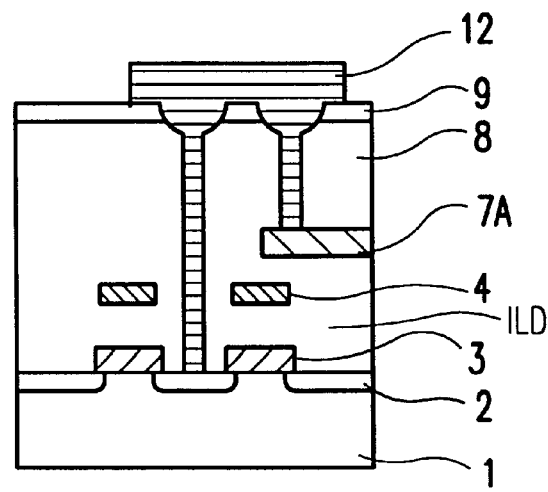

As in the previous embodiments, a conductive material such as tungsten, aluminum, or any other suitable material, is deposited in the contact holes 11A and 11B, and over the surface of the semiconductor device to a thickness of 2000–8000 A to form second conductive layer 12. The second conductive layer 12 is then etched back to leave a portion of layer 12 covering contact holes 11A and 11B, as shown in FIGS. 18A and 18B.

Figure 19A:
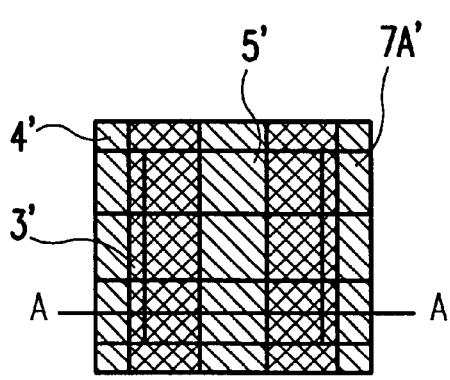
FIGS. 19A and 19B respectively illustrate mask works used to form the cell array and peripheral circuit portions of a semiconductor memory device in accordance with the process steps illustrated in FIGS. 15A–18B.
Figure 19B:
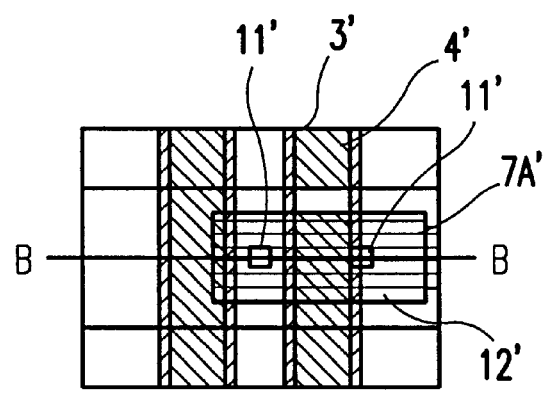

FIGS. 19A and 19B show mask works used during the novel fabrication process to form the various layers of the cell array portion and the peripheral portion, respectively, of the semiconductor memory device. As shown in FIG. 19A, a gate electrode mask 3', a bit line mask 4', a storage electrode mask 5', and plate electrode mask 7A' are respectively used to form the gate electrode 3, bit line 4, storage electrode 5, and plate electrode 7A of the cell array portion of the semiconductor device. Similarly, in FIG. 19B, gate electrode mask 3', bit line mask 4', plate electrode mask 7A', contact hole mask 11', and second conductive layer mask 12' are respectively used to form the gate electrode 3, bit line 4, plate electrode 7A, contact hole 11, and second conductive layer 12 of the peripheral portion of the semiconductor device.

Producing a semiconductor device using this embodiment of the invention results in a high integration device having a relatively low aspect ratio. By patterning the conductive layer 7A as an interconnect line in the peripheral portion of the semiconductor device, the metal contact can be made wider than those produced using conventional processes. This additional dimension reduces the aspect ratio, while permitting an increase in the integration.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but are commensurate with the spirit and scope of the invention as defined by the appended claims.

What is claimed is:

1. A method of forming a portion of a semiconductor device, wherein the formed semiconductor device has at least one storage cell disposed in a cell array portion of a semiconductor memory device, and also has a peripheral circuit area disposed in a peripheral portion of the semiconductor memory device over a semiconductor substrate, the method comprising the steps of:

forming a storage electrode in the cell array portion;

forming a first conductive layer over the storage electrode, wherein the storage electrode and the first conductive layer comprise a storage cell capacitor for the semiconductor device, and the first conductive layer is patterned to form an interconnect line of the semiconductor device;

forming an insulation layer overlying the first conductive layer;

forming a contact hole extending from the top surface of the insulation layer, through the first conductive layer to the surface of the semiconductor substrate in the peripheral surface area in the semiconductor memory device; and forming a second conductive layer filling the contact hole so as to provide an electrical connection with the first conductive layer and the semiconductor substrate in the peripheral circuit area.

2. The method of claim 1 further comprising the steps of:

preparing a silicon base to include source and drain regions spaced apart by a channel region in the silicon base;

forming at least one gate electrode overlying the channel region;

forming an inter layer dielectric (ILD) overlying the silicon base and at least one gate electrode;

forming a dielectric film overlying the storage electrode in the cell array portion of the semiconductor device, wherein the dielectric film is formed prior to said step of forming a first conductive layer, said step of forming a first conductive layer comprising the substeps of forming a first conductive layer over the dielectric film in the cell array portion of the semiconductor memory device and over the ILD in the peripheral circuit area of the semiconductor memory device, wherein the storage electrode, ILD, dielectric film, and cell array portion of the first conductive layer complete a storage cell capacitor for the semiconductor memory device;

forming a planarization layer to planarize a top surface of the first conductive layer;

forming an insulation layer over the planarization layer;

forming a patterned layer of photoresist over the insulation layer in both the cell array and peripheral circuit areas of the semiconductor memory device;

forming a contact hole in the peripheral portion of the semiconductor memory device, wherein said step of forming a second conductive layer comprises the substep of depositing a conductive material in the contact hole and on the insulation layer; and etching back the second conductive layer from a top surface of the semiconductor device without removing the second conductive layer from the contact hole in the peripheral area of the semiconductor device.

3. The method of claim 2, wherein said step of forming an inter layer dielectric (ILD) uses undoped silicate glass (USG) to form the ILD; and wherein the storage electrode is made of phosphorus, the dielectric film is made of oxide nitride oxide (ONO), the first conductive layer is made of tungsten, and the second conductive layer is made of aluminum.

4. The method of claim 2, wherein said step of forming a planarization layer comprises the substep of depositing $O_3$-TEOS (tetra ethoxy silane) to a thickness of 3000–6000 angstroms; and wherein said step of forming a contact hole comprises the substeps of isotropically etching, the insulation layer and planarization layer to a depth of 1000–4000 angstroms, and anisotiopically etching any remainder of the planarization layer and the first conductive layer over a contact point in the peripheral portion of the semiconductor memory device, the contact point being a source region in the silicon base.

5. A method of forming a portion of a semiconductor device, wherein the formed semiconductor device has at least one storage cell, the method comprising:

forming a storage electrode in the semiconductor device;

forming a first conductive layer over the storage electrode, wherein the storage electrode and the first conductive layer comprise a storage cell capacitor for the semiconductor device, and the first conductive layer is patterned to form an interconnect line of the semiconductor device;

forming first and second contact holes in the semiconductor memory device;

forming a second conductive layer on the semiconductor memory device by depositing material in the first and second contact holes so as to provide a connection with the first conductive layer of the semiconductor device, wherein said step of forming a second conductive layer comprises the substep of depositing material in the first and second contact holes so as to provide a metal contact between the first and second contact holes, wherein said step of forming first and second contact holes comprises the substeps of forming the first contact hole over a first contact area on the first conductive layer; and forming the second contact hole over a second contact area on a substrate of the semiconductor device exclusive of the first conductive layer.

6. The method of claim 5, wherein the semiconductor device is a semiconductor memory device having the at least one storage cell disposed in a cell array portion of the semiconductor memory device, and also a peripheral circuit area disposed in a peripheral portion of the semiconductor memory device, the method further comprising the steps of:

preparing a silicon base to include source and drain regions spaced apart by a channel region in the silicon base;

forming at least one gate electrode overlying the channel region;

annealing the semiconductor memory to form an inter layer dielectric (ILD) overlying the silicon base and at least one gate electrode;

forming a dielectric film overlying the storage electrode in the cell array portion of the semiconductor device, wherein the dielectric film is formed prior to said step of forming a first conductive layer, said step of forming a first conductive layer comprising the substeps of forming a first conductive layer over the dielectric film in the cell array portion of the semiconductor memory device and over the ILD in the peripheral circuit area of the semiconductor memory device, wherein the storage electrode, ILD, dielectric film, and cell array portion of the first conductive layer complete a storage cell capacitor for the semiconductor memory device;

forming a planarization layer to planarize a top surface of the first conductive layer;

forming an insulation layer over the planarization layer; and forming a patterned layer of photoresist over the insulation layer in both the cell array and peripheral circuit areas of the semiconductor memory device;

wherein said step of forming first and second contact holes comprises the substep of depositing tungsten in the contact holes and on the insulation layer, wherein the first contact hole is formed in the peripheral portion of the semiconductor memory device.

7. The method of claim 6, wherein said step of annealing the semiconductor memory device is done at a temperature of 800–900° C. using nitrogen gas to form an ILD of boron phosphorous silicate glass (BPSG); and wherein the storage electrode is made of arsenic, the dielectric film is made of PZT ($PbZrTiO_3$), and the first conductive layer is made of polysilicon doped with ions from arsenic.

8. The method of claim 6, wherein said step of forming a contact hole comprises the substeps of isotropically etching the insulation layer and planarization layer, anisotropically etching any remaining areas of the planarization layer over the first contact point on the first conductive layer in the peripheral portion of the semiconductor memory device, and anisotropically etching any remaining areas of the planarization layer and ILD over the second contact point on the silicon base in the peripheral portion of the semiconductor memory device.

9. The method of claim 5, further comprising etching back the second conductive layer to leave a portion of the second conductive layer covering the first and second contact holes and providing a metal contact between the first and second contact holes.

* * * * *